United States Patent
Park et al.

(10) Patent No.: US 12,082,406 B2
(45) Date of Patent: Sep. 3, 2024

(54) ACTIVE RESISTOR ARRAY OF SEMICONDUCTOR MEMORY DEVICE

(71) Applicant: Samsung Electronics Co., Ltd., Suwon-si (KR)

(72) Inventors: Ansoo Park, Suwon-si (KR); Ahreum Kim, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 204 days.

(21) Appl. No.: 17/883,842

(22) Filed: Aug. 9, 2022

(65) Prior Publication Data
US 2023/0328977 A1 Oct. 12, 2023

(30) Foreign Application Priority Data
Apr. 12, 2022 (KR) .................. 10-2022-0045377

(51) Int. Cl.
| | |
|---|---|
| *G11C 11/418* | (2006.01) |
| *H01L 27/08* | (2006.01) |
| *H10B 41/10* | (2023.01) |
| *H10B 41/35* | (2023.01) |
| *H10B 41/41* | (2023.01) |

(52) U.S. Cl.
CPC ......... *H10B 41/35* (2023.02); *H01L 27/0802* (2013.01); *H10B 41/10* (2023.02); *H10B 41/41* (2023.02)

(58) Field of Classification Search
CPC .................................................. G11C 11/418
See application file for complete search history.

(56) References Cited

U.S. PATENT DOCUMENTS

| | | |
|---|---|---|
| 8,928,397 B2 | 1/2015 | Kodera et al. |
| 8,952,728 B2 | 2/2015 | Takewaki et al. |
| 9,432,048 B2 | 8/2016 | Isozaki |
| (Continued) | | |

FOREIGN PATENT DOCUMENTS

| | | |
|---|---|---|
| JP | 2010-238723 A | 10/2010 |
| KR | 10-2006-0128352 A | 12/2006 |
| KR | 10-2007-0021607 A | 2/2007 |

OTHER PUBLICATIONS

Extended European Search Report dated Oct. 26, 2023 issued in European Patent Application No. 22208813.0-1212.

*Primary Examiner* — Jason Lappas
(74) *Attorney, Agent, or Firm* — Harness, Dickey & Pierce, P.L.C.

(57) ABSTRACT

An active resistor array of a semiconductor memory device comprises a first active resistor in a first active resistor region; a second active resistor in the first active resistor region and arranged in parallel with the first active resistor, and an isolation element layer interposed therebetween; a third active resistor formed in a second active resistor region; a first selection transistor formed in a first selection transistor region and connected to the second active resistor; and a second selection transistor formed in a second selection transistor region and connected to the third active resistor. The first and second selection transistors are connected to the same gate layer. The gate layer of the first and second selection transistors is on the isolation element layer. Since example embodiments may help to ensure the uniformity of the layout pattern, active resistance distribution may be improved due to reduction in process variation.

20 Claims, 16 Drawing Sheets

(56) References Cited

U.S. PATENT DOCUMENTS

| | | | |
|---|---|---|---|
| 9,472,500 | B2 | 10/2016 | Kim et al. |
| 10,803,922 | B2 | 10/2020 | Hamada et al. |
| 2006/0202241 | A1 | 9/2006 | Koyama et al. |
| 2020/0183791 | A1* | 6/2020 | Park .................. G06F 11/1458 |
| 2022/0122967 | A1 | 4/2022 | Kim et al. |

* cited by examiner

3000

ACTIVE RESISTOR ARRAY OF SEMICONDUCTOR MEMORY DEVICE

CROSS-REFERENCE TO RELATED APPLICATIONS

This application claims priority under 35 U.S.C. § 119 to Korean Patent Application No. 10-2022-0045377 filed on Apr. 12, 2022, in the Korean Intellectual Property Office, the disclosure of which is incorporated by reference herein in its entireties.

BACKGROUND

Various example embodiments relate to a semiconductor memory device, and more particularly, to an active resistor array of the semiconductor memory device and/or a layout structure thereof.

The semiconductor memory device may be largely divided into a volatile semiconductor memory device and a non-volatile semiconductor memory device. A volatile semiconductor memory device has a high read/write speed. However, a volatile semiconductor memory device has a disadvantage in that the stored data is erased when the power supply is cut off. On the other hand, in the nonvolatile semiconductor memory device, data may be maintained even if power supply is interrupted. Therefore, the nonvolatile semiconductor memory device is used to store data to be maintained regardless of whether power is supplied or not. Semiconductor memory devices are widely used for driving and/or storing electronic devices such as computers and/or smart phones. In the semiconductor memory device, technologies for reducing the chip size for high-capacity and/or high-integration are being developed.

A semiconductor memory device may be divided into a memory cell area and a peripheral circuit area. The peripheral circuit area may allow data to be stored in the memory cell area through an internal operation. The peripheral circuit area may generate various internal voltages for storing data in the memory cell area. The peripheral circuit area may include voltage divider to generate various levels of internal power. The semiconductor memory device may implement the voltage divider as an active resistor array.

SUMMARY

The active resistor array used in the voltage divider may be implemented with an analog circuit. In general, the area occupied by the analog circuit in the peripheral circuit area of the semiconductor memory device may be approximately 30%. Of the analog circuit area of the peripheral circuit area, the active resistor array used for the voltage divider about 5% of the area. Since the active resistor array used in the voltage divider is configured with a repeated layout pattern of the active resistor element and the selection transistor, it may be possible to reduce the overall chip size area by changing the layout structure.

Various example embodiments provide an active resistor array of a semiconductor memory device, comprising a first active resistor in a first active resistor region; a second active resistor in the first active resistor region and arranged in parallel with the first active resistor and an isolation element layer interposed between the second active resistor and the first active resistor; a third active resistor in a second active resistor region; a first selection transistor in a first selection transistor region and connected to the second active resistor; and a second selection transistor in a second selection transistor region and connected to the third active resistor. The first and second selection transistors are connected to a same gate layer. The gate layer of the first and second selection transistors is on the isolation element layer.

Alternatively or additionally, according to various example embodiments, an active resistor array of a semiconductor memory device comprises a first active resistor region in which a first plurality of active resistors are arranged in a first direction with an isolation element layer between ones of the first plurality of active resistors; a second active resistor region in which a second plurality of active resistors are arranged in the first direction and an isolation element layer between ones of the second plurality of active resistors; and a selection transistor region between the first and second active resistor regions. In the selection transistor region, a selection transistor connected to the active resistor of the first active resistor region and a selection transistor connected to the active resistor of the second active resistor region are alternately arranged in the first direction. A gate layer of a selection transistor in the selection transistor region passes over the isolation element layers in the first and second active resistor regions in a second direction perpendicular to the first direction.

Alternatively or additionally, according to various example embodiments, an active resistor array of a semiconductor memory device comprises a first active resistor on a semiconductor substrate; a second active resistor in parallel with the first active resistor and an isolation element layer between the second active resistor and the first active resistor; and a gate layer of a transistor, the transistor configured to select the first active resistor or the second active resistor, the gate layer on the isolation element layer.

BRIEF DESCRIPTION OF THE FIGURES

The above and other objects and features of the present disclosure will become apparent by describing in detail various example embodiments thereof with reference to the accompanying drawings.

DETAILED DESCRIPTION

Figure 1:
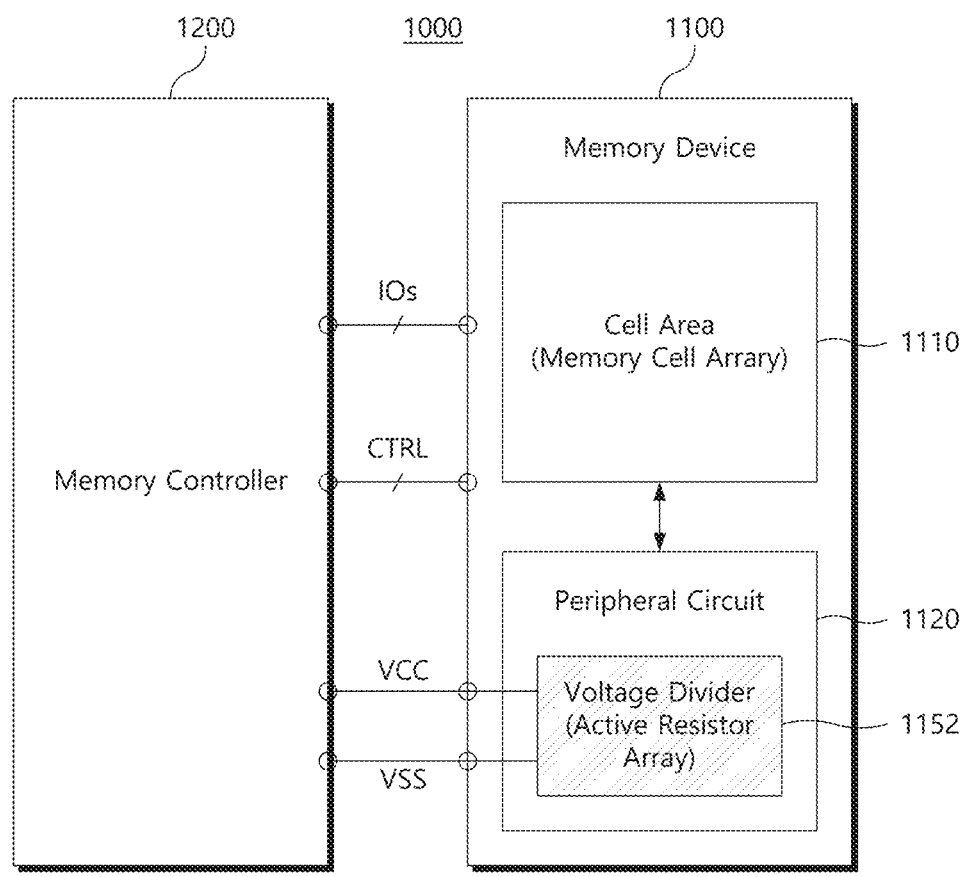
FIG. 1 is a block diagram illustrating a data storage device according various example embodiments.

Hereinafter, various example embodiments will be described with reference to the accompanying drawings. In the following description, the same elements will be designated by the same reference numerals although they are shown in different drawings. Further, in the following description, a detailed description of known functions and configurations incorporated herein will be omitted for example when it may make the subject matter of example embodiments rather unclear.

FIG. 1 is a block diagram illustrating a data storage device according various example embodiments. Referring to FIG. 1, a data storage device 1000 includes a semiconductor memory device 1100 and a memory controller 1200. The semiconductor memory device 1100 and the memory controller 1200 may be connected through data input/output lines IOs, control lines CTRL, and power lines VCC and ground lines VSS. The data storage device 1000 may store data in the semiconductor memory device 1100 under the control of the memory controller 1200.

The semiconductor memory device 1100 includes a memory cell area 1110 and a peripheral circuit area 1120. The memory cell area 1110 includes a memory cell array. The memory cell array is composed of a plurality of memory cells, and one or more data may be stored in each memory cell. For example, each of the plurality of memory cells may store one or more bits of information.

The peripheral circuit area 1120 may receive commands, addresses, and/or data from the memory controller 1200, and may store data in the memory cell area 1110 through internal operations. Also, the peripheral circuit area 1120 may read data stored in the memory cell area 1110 and may provide the data to the memory controller 1200. Meanwhile, the peripheral circuit area 1120 may receive external power through the power line VCC and the ground line VSS, and may generate internal power necessary for or used for internal operations such as reading and/or writing.

A peripheral circuit area 1120 includes a voltage divider 1152 to generate various levels of internal power. The voltage divider 1152 may be configured as an active resistor array. The active resistor array may include a plurality of active resistors and a plurality of selection transistors. In the semiconductor memory device 1100 according various example embodiments, since the layout structure of the active resistor array has a uniform pattern, it may be possible to reduce the chip size and/or improve circuit characteristics.

Figure 2:
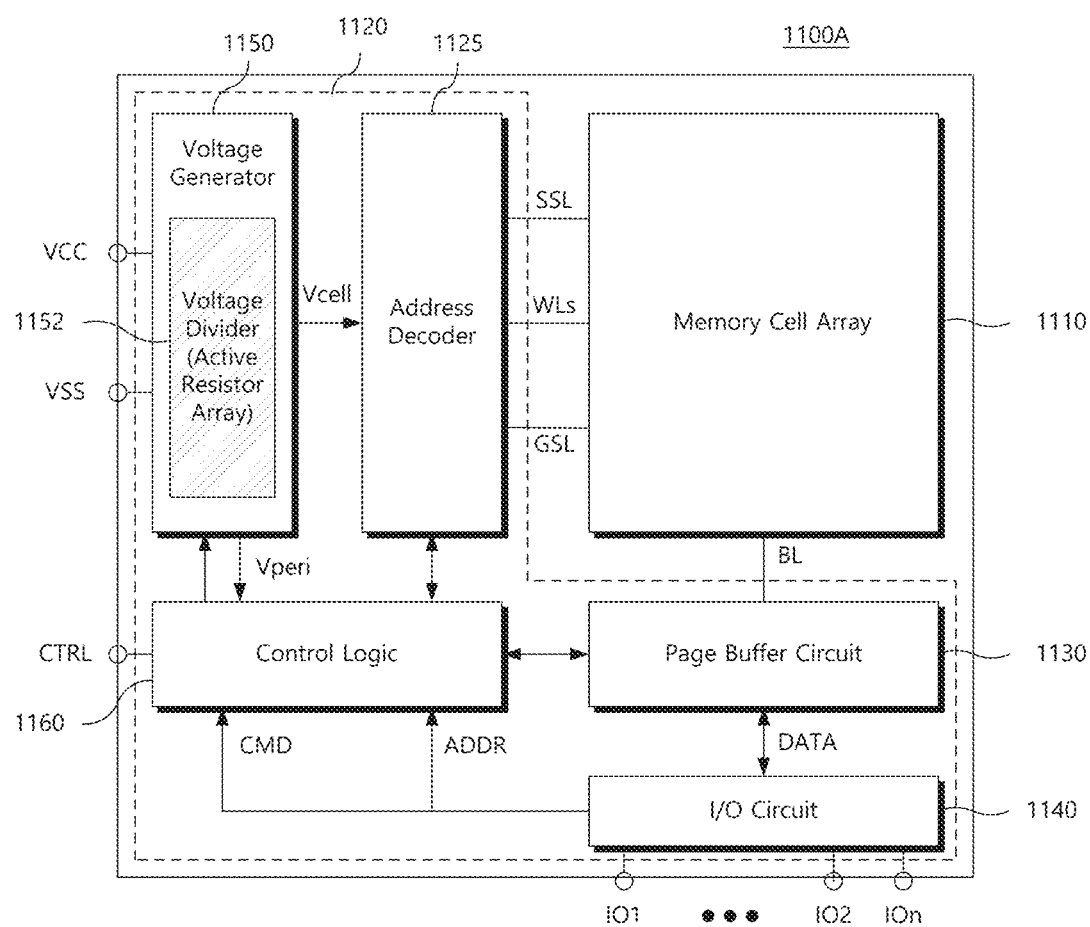
FIG. 2 is a block diagram illustrating the semiconductor memory device shown in FIG. 1.

FIG. 2 is a block diagram illustrating the semiconductor memory device shown in FIG. 1. In FIG. 2, a flash memory 1100A is illustrated by way of example. Referring to FIG. 2, the flash memory 1100A includes a memory cell area 1110 and a peripheral circuit area 1120. The memory cell area 1110 includes a memory cell array 1110, an address decoder 1125, a page buffer circuit 1130, a data input/output circuit 1140, a voltage generator 1150, and a control logic 1160.

The memory cell array 1110 includes a plurality of memory blocks. Each memory block may have a two-dimensional structure and/or a three-dimensional structure. In a memory block having a two-dimensional structure (or a horizontal structure), memory cells are formed in a horizontal direction with a substrate. However, in a memory block having a three-dimensional structure (or vertical structure), memory cells are formed in a direction perpendicular to the substrate.

The address decoder 1125 is connected to the memory cell array 1110 through selection lines SSL and GSL or word lines WLs. The address decoder 1125 may receive a cell voltage Vcell from the voltage generator 1150 and may provide program voltages and/or read voltages to a word line selected by the control of the control logic 1160.

The page buffer circuit 1130 may be connected to the memory cell array 1110 through bit lines BLs. The page buffer circuit 1130 may temporarily store data that is to be programmed in the selected page and/or data read from the selected page.

The input/output circuit 1140 may be internally connected to the page buffer circuit 1130 through data lines, and may be externally connected to the memory controller 1200 (refer to FIG. 1) through input/output lines I/O. The data input/output circuit 1140 may receive program data from the memory controller 1200 during a program operation and provide read data to the memory controller 1200 during a read operation.

The voltage generator 1150 may receive power VCC and VSS from the memory controller 1200 and may generate a memory cell area voltage Vcell and a peripheral circuit area voltage Vperi. The memory cell area voltage Vcell is a voltage required to read or write data. The peripheral circuit area voltage Vperi is a voltage for the operation of the peripheral circuit area 1120. The memory cell area voltage Vcell may be provided to the address decoder 1125, and the peripheral circuit area voltage Vperi may be provided to the control logic 1160.

The control logic 1160 controls operations such as programming, reading, and erasing of the flash memory 1100A using commands CMD, addresses ADDR, and control signals CTRL provided from the memory controller 1200. may do.

Continuing to refer to FIG. 2, the voltage generator 1150 may include a voltage divider 1152 for generating or particularly or precisely generating various internal voltages of the flash memory 1100A. The voltage divider 1152 is configured as resistive elements, and may be implemented through an active resistor array, which may be advantageous in terms of process variation distribution. The internal configuration and layout structure of the voltage divider 1152 implemented as an active resistor array will be described in more detail below.

Analog circuits may occupy about 30% of the peripheral circuit area 1120 of the flash memory 1100A. The active resistor array may occupy about 5% of the total area of the analog circuits. The flash memory 1100A may be implemented in a three-dimensional structure, e.g. maybe highly integrated into a COP structure in which the memory cell array 1110 is integrated on the peripheral circuit area 1120. In this situation, reducing the area of the active resistor array may be advantageous in many ways. The semiconductor memory device (refer to FIG. 1, 1100) of example embodiments has a layout structure of an active resistor array having a repeated pattern, so that a chip size of the semiconductor memory device 1100 may be reduced and/or circuit characteristics may be improved.

Figure 3:
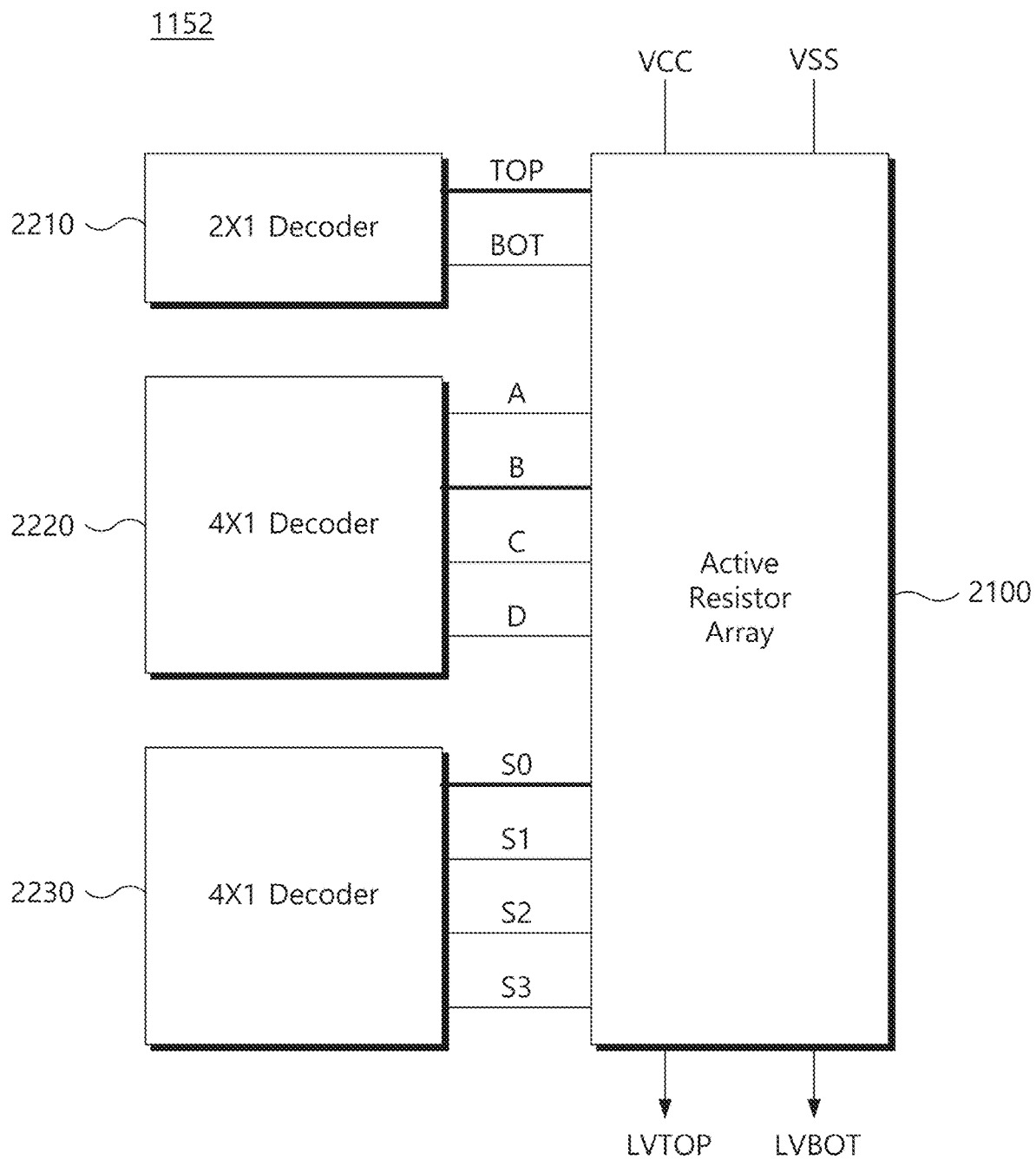
FIG. 3 is a block diagram showing an internal configuration of the voltage divider shown in FIGS. 1 and 2.

FIG. 3 is a block diagram showing an internal configuration of the voltage divider shown in FIGS. 1 and 2. Referring to FIG. 3, the voltage divider 1152 includes an active resistor array 2100 and a plurality of decoder blocks 2210, 2220, and 2230. The active resistor array 2100 receives powers VCC and VSS from the memory controller 1200 (refer to FIG. 1), and receives internal voltages LVTOP and LVBOT under the control of the plurality of decoder blocks 2210, 2220, 2230. Each of the internal voltages LVTOP and LVBOT may have various levels of operating voltages. The active resistance array 2100 may receive power VCC and VSS from the memory controller 1200 and may generate internal voltages LVTOP and LVBOT under the control of a plurality of decoder blocks 2210, 2220, and 2230. Each of the internal voltages LVTOP and LVBOT may have various levels of operating voltages.

The first decoder block 2210 may activate either TOP or BOT through two code signals. The second decoder block 2220 may activate any one (e.g. precisely one) of A, B, C, and D through four code signals. The third decoder block 2230 may activate any one of S0, S1, S2, and S3 through four code signals. Code signals of the first to third decoder blocks 2210, 2220, and 2230 may be internally generated. The example of FIG. 3 shows a case in which TOP, B, and S0 are activated, respectively.

Figure 4:
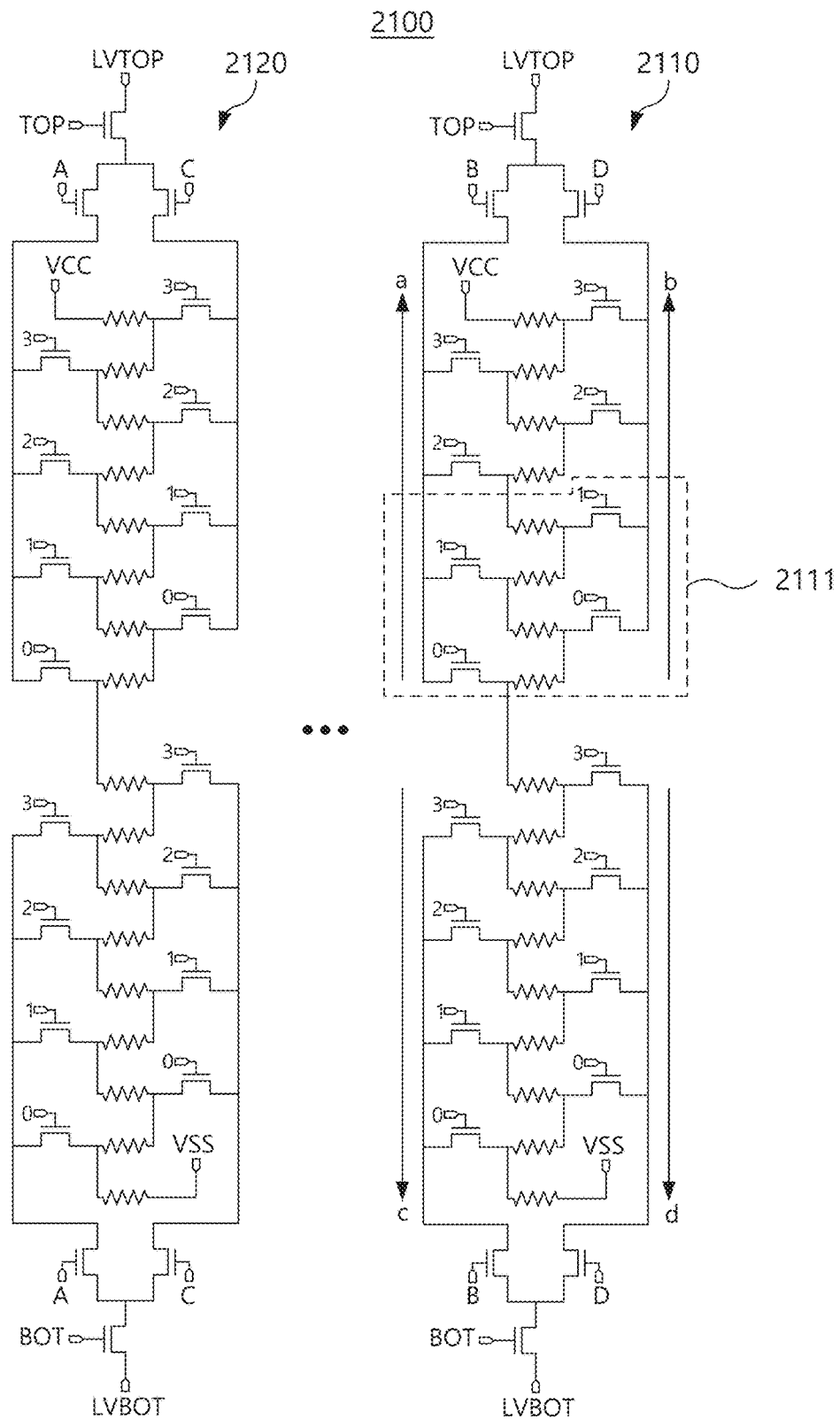
FIG. 4 is a circuit diagram illustrating the active resistor array shown in FIG. 3.

FIG. 4 is a circuit diagram illustrating the active resistor array shown in FIG. 3. Referring to FIG. 4, the active resistor array 2100 may include a plurality of active resistor chains 2110 and 2120. Each active resistor chain may include a plurality of active resistors and a plurality of selection transistors. In each active resistor chain, a plurality of active resistors may be connected in series between the power terminal VCC and the ground terminal VSS. A selection transistor may be connected to each active resistor.

The active resistor array 2100 may have various layout structures. For example, the first active resistor chain 2110 may be divided into a top part and a bottom part. The first active resistor chain 2110 may include a selection transistor for selecting the top part and the bottom part. The top part may be selected by the TOP signal, and the bottom part may be selected by the BOT signal. The divided voltage may be provided to the LVTOP terminal when the top part is selected and be provided to the LVBOT terminal when the bottom part is selected.

Meanwhile, the first active resistor chain 2110 may be divided into a left part and a right part. The first active resistor chain 2110 may include a selection transistor for selecting a left part and a right part. The left part may be selected by the B signal, and the right part may be selected by the D signal. A left part and a right part of the second active resistor chain 2120 may be selected by the A signal and the C signal, respectively. As used herein, "left" and "right" and "top" and "bottom" are for convenience of description with respect to the figures, and are not necessarily limited to a particular layout and/or orientation thereof.

The divided voltage resistance may be provided in an "a" direction when the TOP and B signals are activated, and may be provided in the "b" direction when the TOP and D signals are activated. The divided voltage resistance may be provided in the "c" direction when the BOT and B signals are activated, and in the "d" direction when the BOT and D signals are activated.

Figure 5:
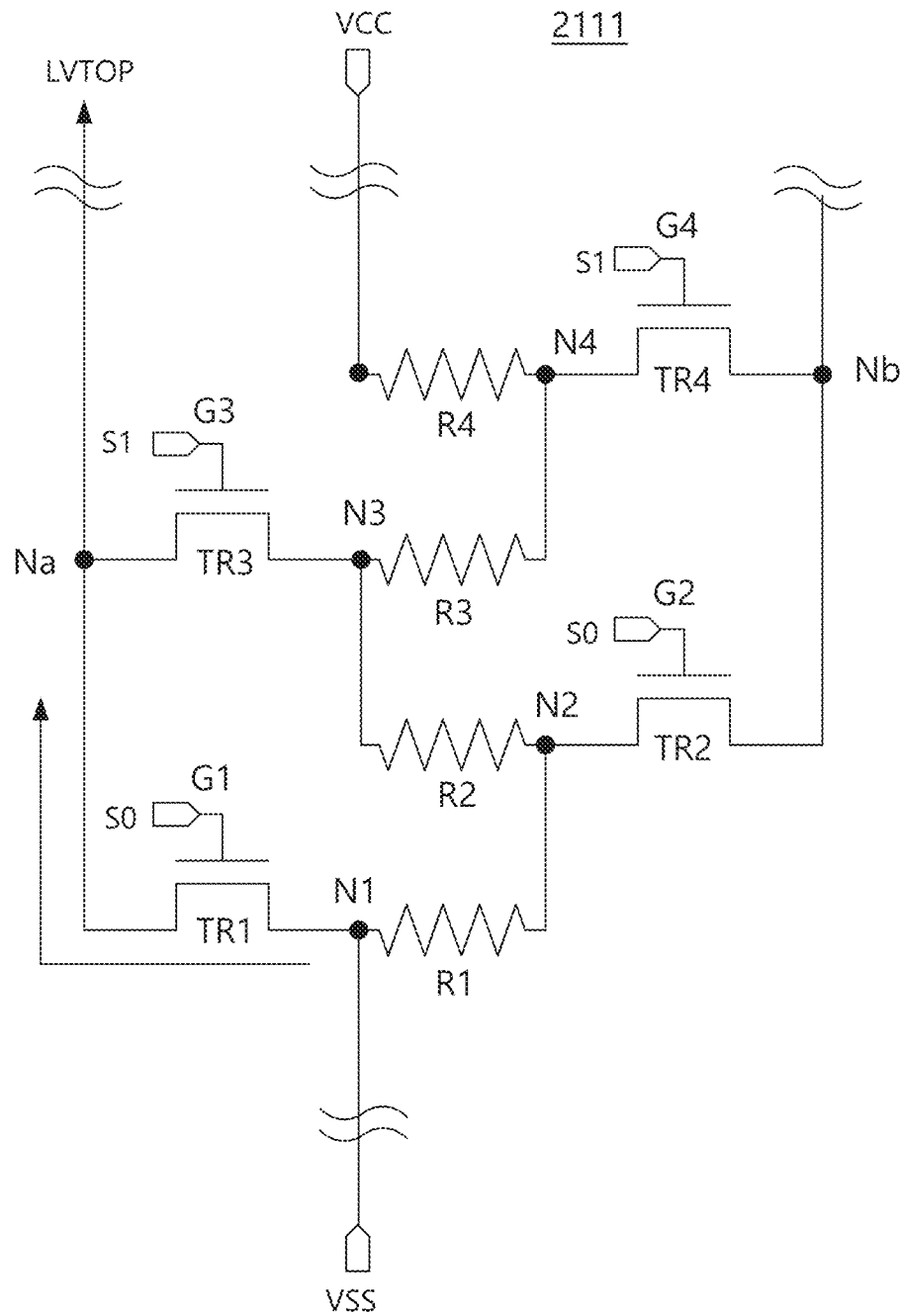
FIG. 5 is a circuit diagram illustrating in detail the internal configuration and connection relationship of the first active resistor chain shown in FIG. 4.

FIG. 5 is a circuit diagram illustrating in detail the internal configuration and connection relationship of the first active resistor chain shown in FIG. 4. Referring to FIG. 5, in a portion 2111 of the first active resistor chain 2110, first to fourth active resistors R1 to R4 are connected in series. The first active resistor R1 is connected between the first node N1 and the second node N2, and the second active resistor R2 is connected between the second node N2 and the third node N3. The third active resistor R3 is connected between the third node N3 and the fourth node N4, and the fourth active resistor R4 is connected to the fourth node N4. Each of the active resistors may be or may correspond to a serpentine structure and may include, for example, a resistive element such as but not limited to polysilicon; however, example embodiments are not limited thereto.

Meanwhile, a portion 2111 of the first active resistor chain 2110 may include a plurality of selection transistors for selecting the first to fourth active resistors R1 to R4. The first selection transistor TR1 is connected between a node Na and the first node N1 and may receive an S0 signal through the first gate G1. The second selection transistor TR2 is connected between the b node Nb and the second node N2 and may receive an S0 signal through the second gate G2. The third selection transistor TR3 is connected between a node Na and the third node N3 and may receive an S1 signal through the third gate G3. The fourth selection transistor TR4 is connected between the b node Nb and the fourth node N4 and may receive the S1 signal through the fourth gate G4. When the TOP signal and the B signal are activated and the S0 signal is activated, the divided voltage of the first node N1 may be provided to the LVTOP terminal through a node Na.

Figure 6:
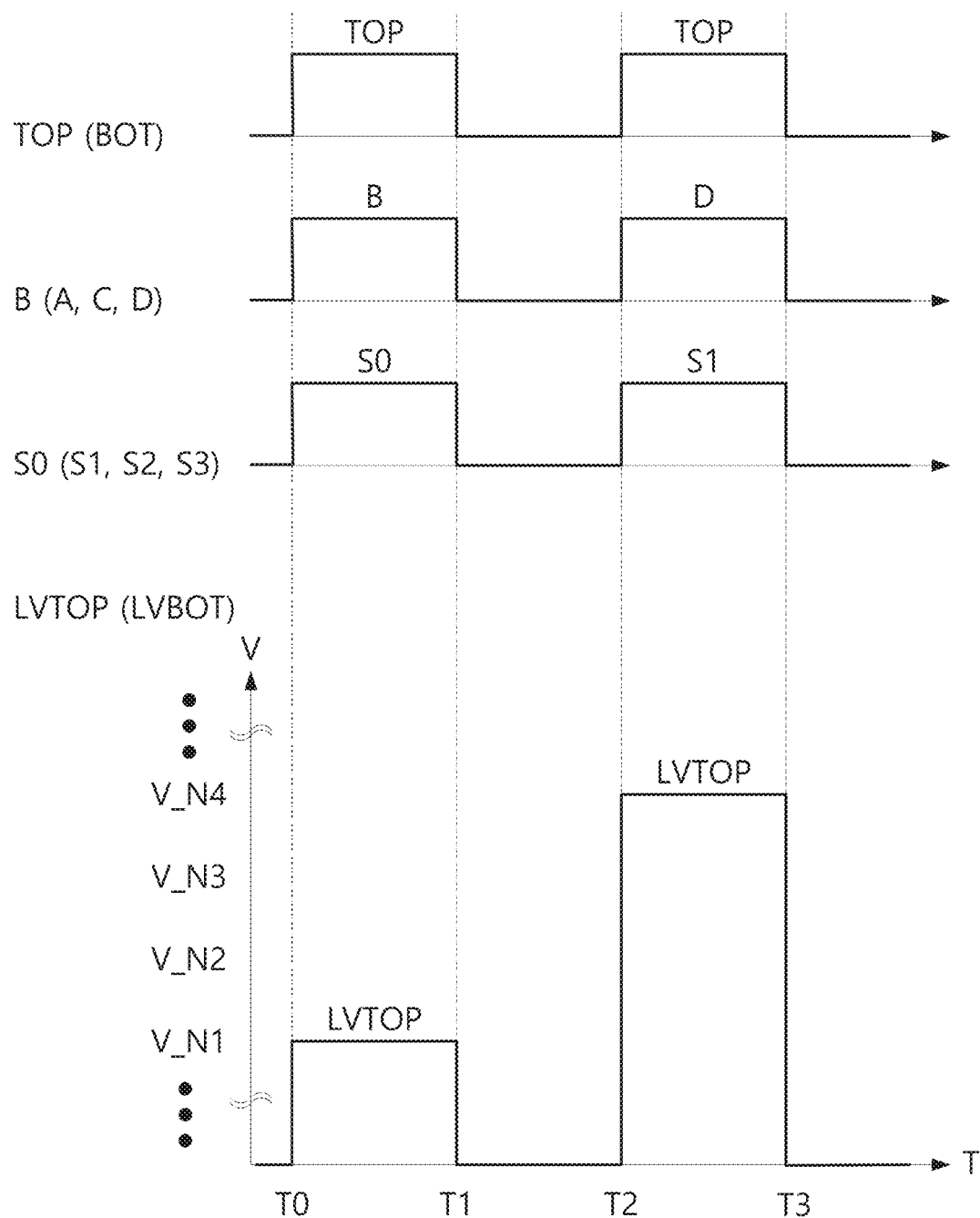
FIG. 6 is a timing diagram for explaining the operation of the first active resistor chain shown in FIGS. 3 to 5.

FIG. 6 is a timing diagram for explaining the operation of the first active resistor chain shown in FIGS. 3 to 5. Referring to FIG. 6, TOP, B, and S0 signals are input to the first active resistor chain (see FIG. 4, 2110) in a period T0-T1. In the period T2-T3, TOP, D, and S1 signals are input. In the period T0-T1, as described with reference to FIG. 5, the divided voltage V_N1 of the first node N1 is provided to the LVTOP terminal through a node Na. In the period T2-T3, the divide voltage V_N4 of the fourth node N4 is provided to the LVTOP terminal through the b node Nb.

Figure 7:
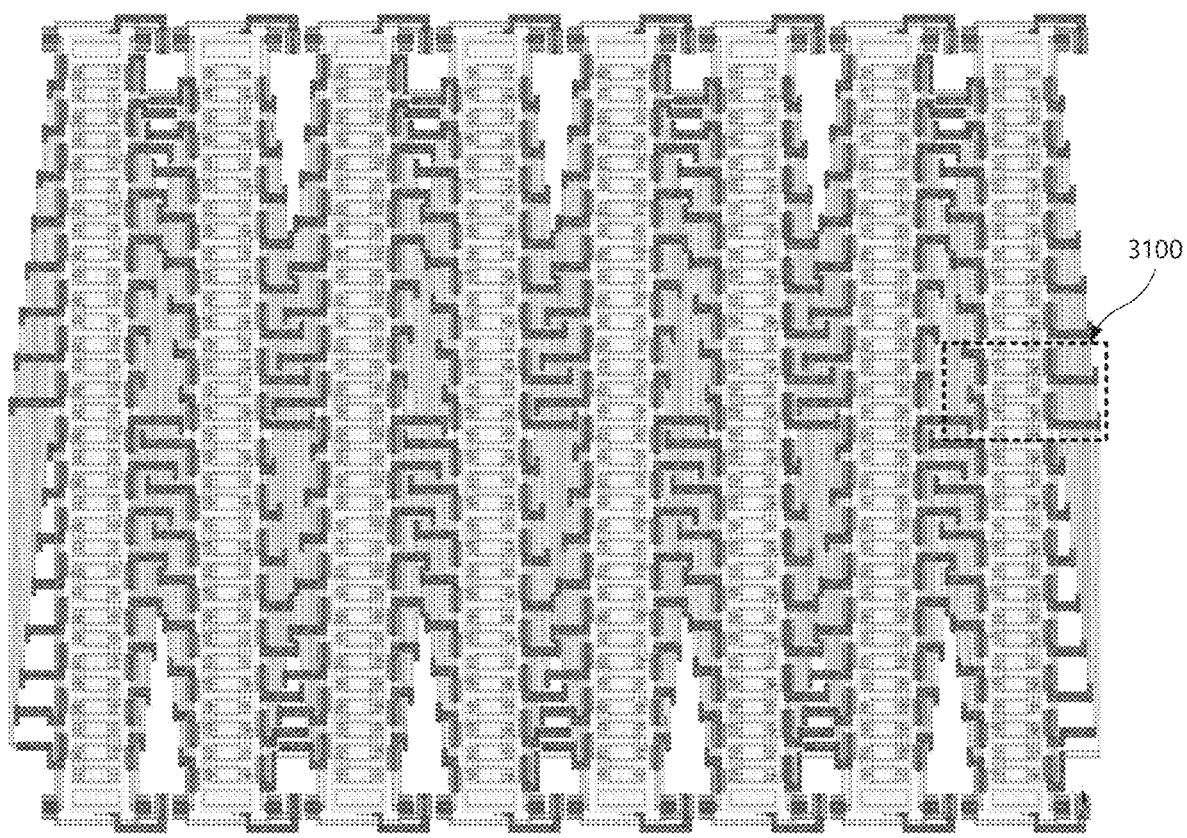
FIG. 7 is a structural diagram illustrating a layout of the active resistor array shown in FIG. 3.
Figure 8:
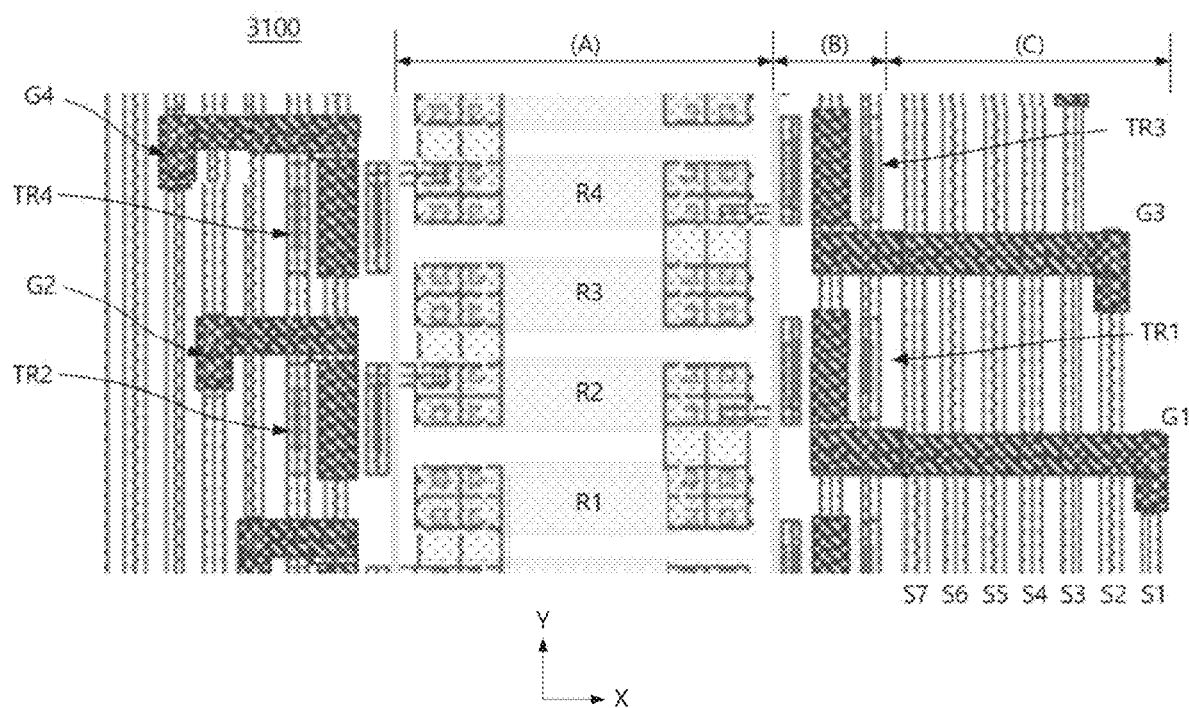
FIG. 8 is an enlarged view of a portion 3100 of the active resistor array 3000 shown in FIG. 7.

FIG. 7 is a structural diagram illustrating a layout of the active resistor array shown in FIG. 3. FIG. 8 is an enlarged view of a portion 3100 of the active resistor array 3000 shown in FIG. 7. Referring to FIGS. 7 and 8, the active resistor array 3100 may include an active resistor region A, a selection transistor region B, and a signal line region C.

The first to fourth active resistors R1 to R4 are disposed in a first direction (e.g., a Y direction) in the active resistor region The first and second active resistors R1 and R2 may be connected to a metal contact through a metal wiring. Similarly, the second and third active resistors R2 and R3 and the third and fourth active resistors R3 and R4 may be connected like a chain.

The selection transistor region B may be disposed on both sides of the active resistor region A in the second direction (or the X-direction). Referring to FIG. 8, a first selection transistor TR1 may be disposed in a second direction (e.g., an X direction) of the second active resistor R2 and a second selection transistor TR2 may be disposed in the first direction of the second active resistor R2. In addition, the third selection transistor TR3 may be disposed in the second direction of the fourth active resistor R4 and the fourth selection transistor TR4 may be disposed in the first direction of the fourth active resistor R4.

The signal line region C may be arranged adjacent to or near the selection transistor region B. The signal line region C includes a plurality of signal lines S1-S7, and each signal line may be connected to gates of selection transistors. For example, the first signal line S1 may be connected to the gate G1 of the first selection transistor TR1, and the second signal line S2 may be connected to the gate G3 of the third selection transistor TR3.

Figure 9:
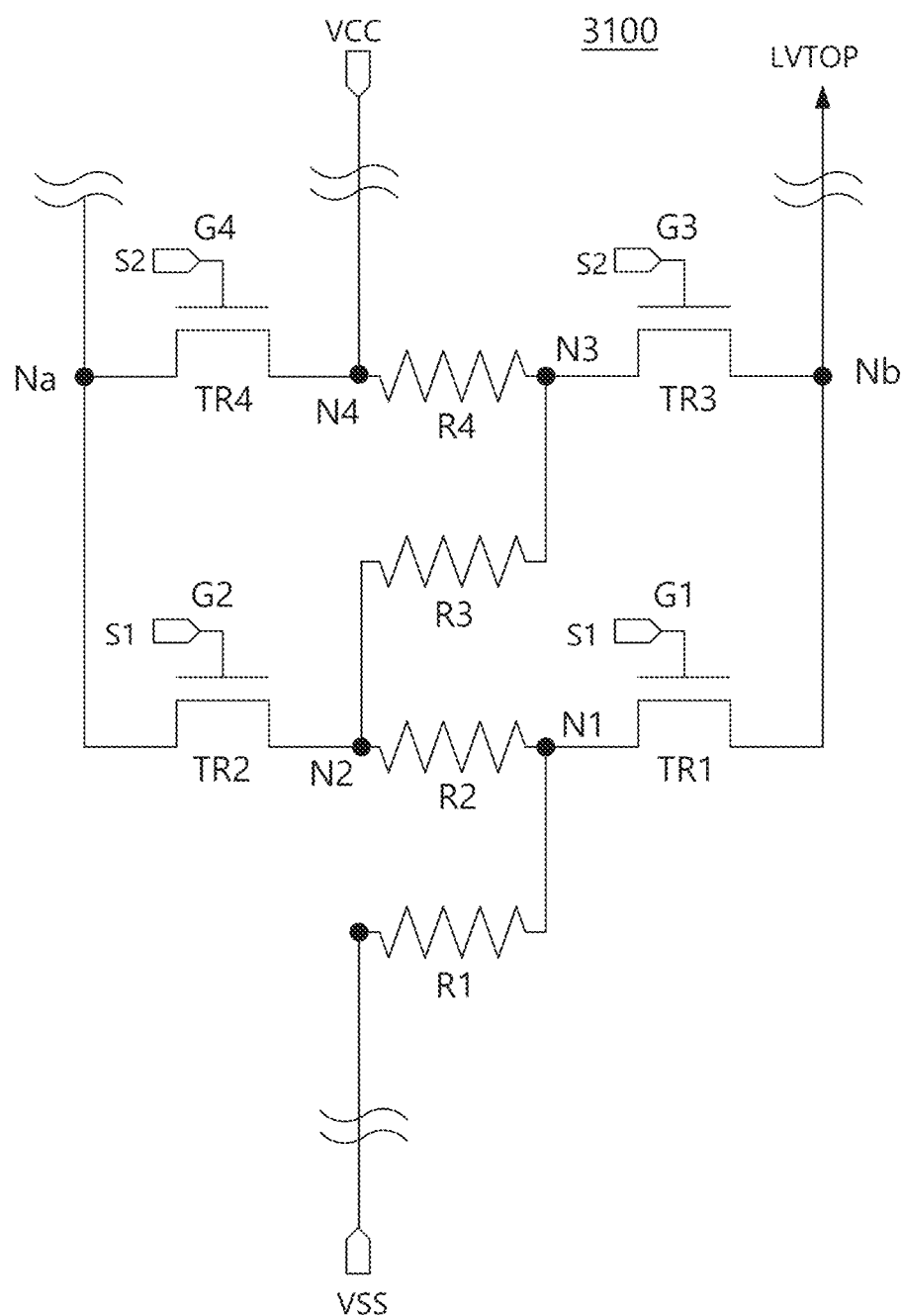
FIG. 9 is a circuit diagram illustrating the active resistor array shown in FIG. 8.

FIG. 9 is a circuit diagram illustrating the active resistor array shown in FIG. 8. Referring to FIG. 9, the active resistor array 3100 includes first to fourth active resistors R1-R4 connected in series. The first active resistor R1 is connected to the first node N1, the second active resistor R2 is connected between the first node N1 and the second node N2, and the third active resistor is R3 is connected between the second node N2 and the third node N3, and the fourth active resistor R4 is connected between the third node N3 and the fourth node N4.

The first selection transistor TR1 is connected between the "b" node Nb and the first node N1 and may receive an S1 signal through the first gate G1. The second selection transistor TR2 is connected between the "a" node Na and the second node N2 and may receive the S1 signal through the second gate G2. The third selection transistor TR3 is connected between the "b" node Nb and the third node N3 and may receive an S2 signal through the third gate G3. The fourth selection transistor TR4 is connected between the "a" node Na and the fourth node N4 and may receive the S2 signal through the fourth gate G4. When the S1 signal is activated while the TOP signal and the D signal are activated (refer to FIG. 4), the divided voltage of the first node N1 may be provided to the LVTOP terminal through the b node Nb.

In the active resistor array 3000 illustrated in FIGS. 7-9, the active resistor region A, the selection transistor region B, and the signal line region C are regularly arranged in a uniform pattern. In the active resistor array 3000, a plurality of active resistor regions A are regularly arranged with a selection transistor region B and a signal line region C interposed therebetween. Accordingly, the semiconductor memory device 1100 may more easily secure the uniformity of the layout pattern, facilitate layout design due to pattern repetition, and reduce the size of the peripheral circuit area.

Figure 10:
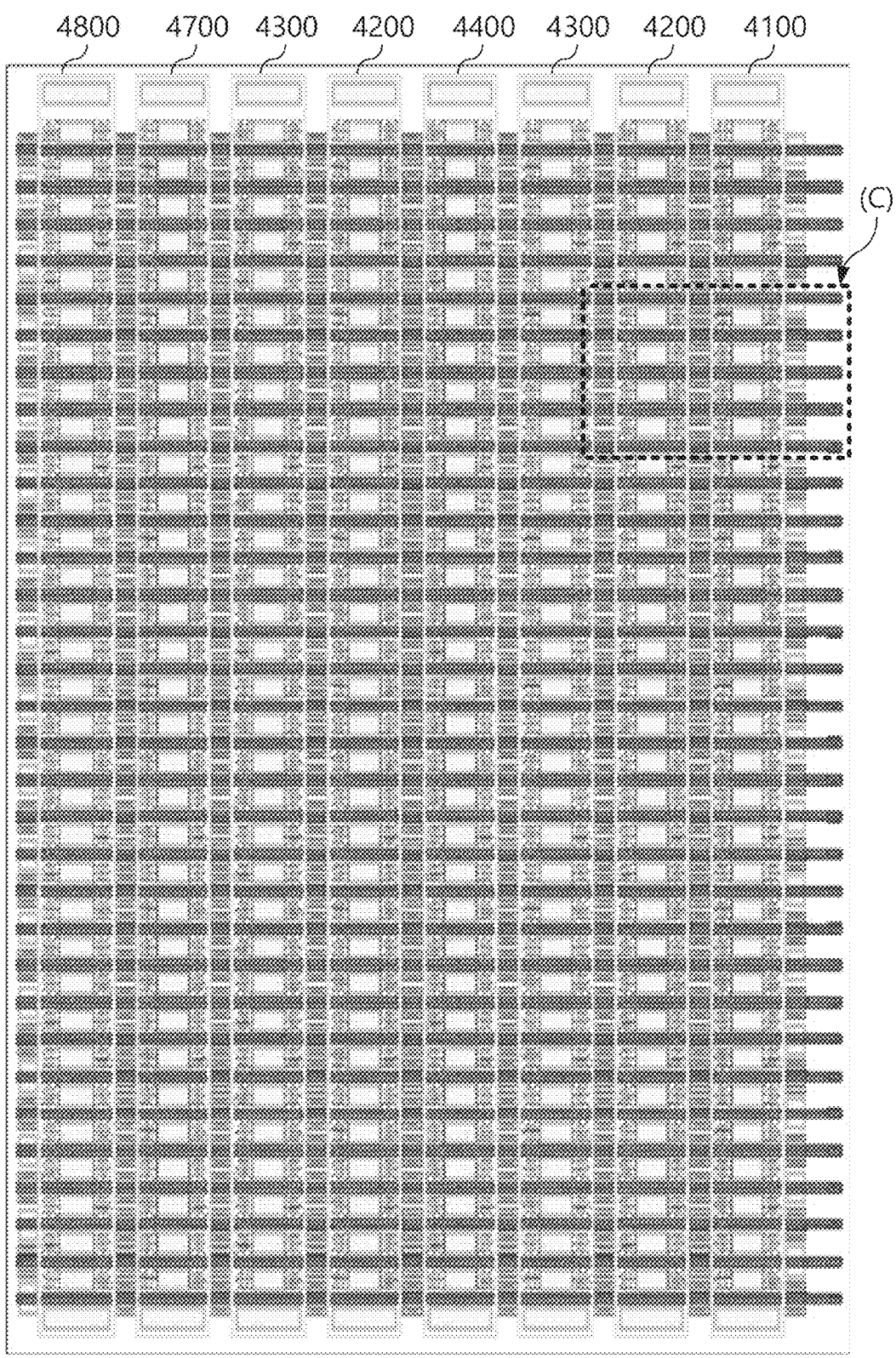
FIG. 10 is a layout structural diagram illustrating various example embodiments of the active resistor array shown in FIG. 3.

FIG. 10 is a layout structural diagram illustrating various example embodiments of the active resistor array shown in FIG. 3. Referring to FIG. 10, the active resistor array 4000 may include a plurality of active resistor chains 4100, 4200, . . . , 4800. The same layout pattern may be repeated for a plurality of active resistor chains. In the first active resistor chain 4100, a plurality of active resistors may be connected in series between a power supply voltage VCC and a ground voltage VSS, and a selection transistor may be connected to each active resistor.

Figure 11:
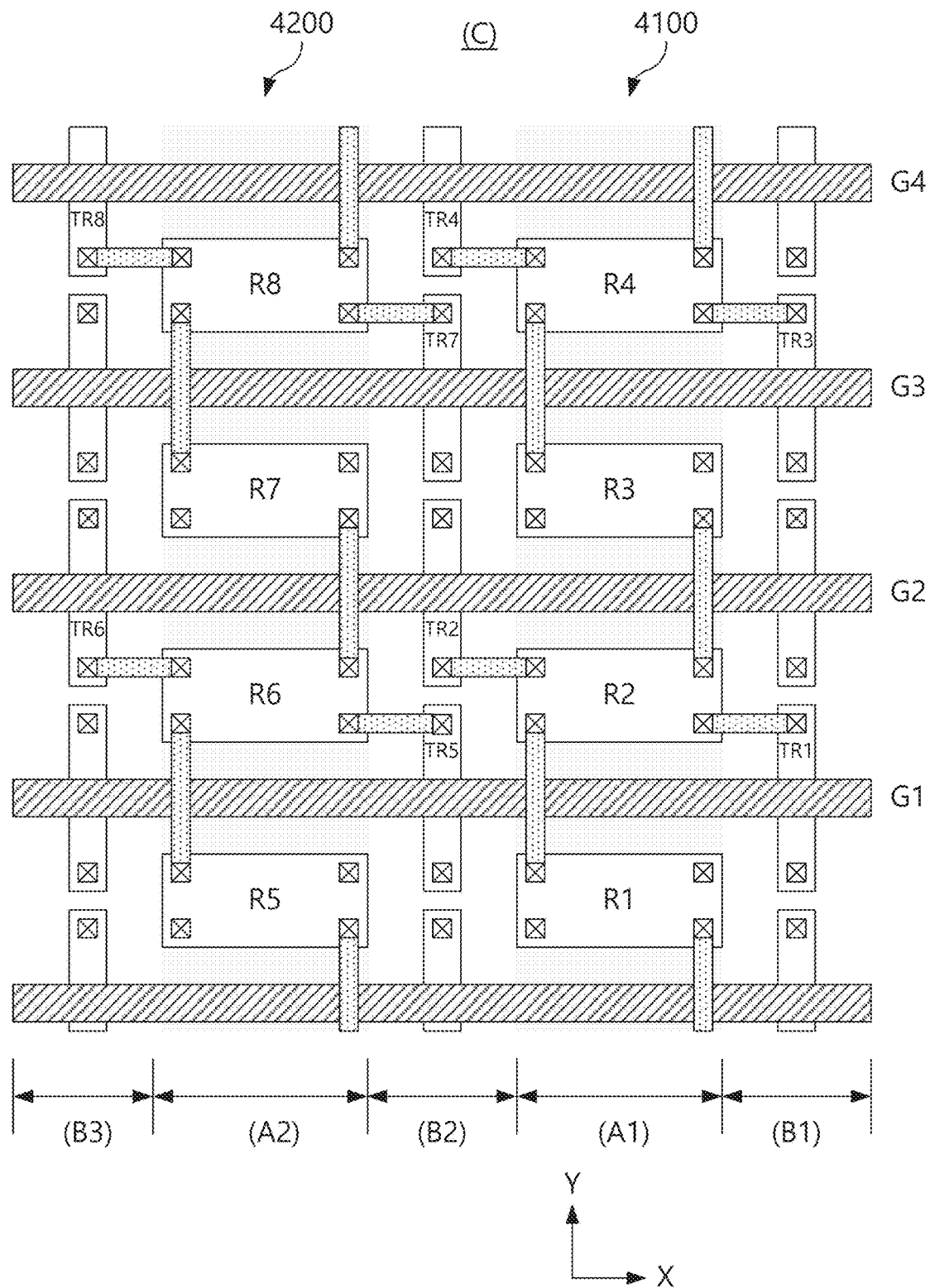
FIG. 11 is an enlarged view of part (C) of the first and second active resistor chains of the active resistor array shown in FIG. 10.

FIG. 11 is an enlarged view of part (C) of the first and second active resistor chains of the active resistor array shown in FIG. 10. Referring to FIG. 11, the active resistor array 4000 includes first and second active resistor chains 4100 and 4200. The first active resistor chain 4100 may include first to fourth active resistors R1-R4 and first to fourth selection transistors TR1-TR4. Similarly, the second active resistor chain 4200 may include fifth to eighth active resistors R5-R8 and fifth to eighth selection transistors TR5-TR8.

The first and second active resistor chains 4100 and 4200 include active resistor regions A1 and A2 and selection transistor regions B1, B2 and B3. The active resistor regions A1 and A2 and the selection transistor regions B1, B2 and B3 may be arranged in a repeating layout pattern in a first direction (or an "X" direction with reference to FIG. 11).

In the first active resistor region A1, the first to fourth active resistors R1 to R4 may be connected (e.g. in series) in a second direction (or a "Y" direction with reference to FIG. 11) like a chain. A first selection transistor TR1 connected to the second active resistor R2 and a third selection transistor TR3 connected to the fourth active resistor R4 may be positioned in the first selection transistor region B 1. A second selection transistor TR2 connected to the second active resistor R2 and a fourth selection transistor TR4 connected to the fourth active resistor R4 may be positioned in the second selection transistor region B2.

In the second active resistor region A2, fifth to eighth active resistors R5-R8 may be connected (e.g. in series) in the Y direction. A fifth selection transistor TR5 connected to the sixth active resistor R6 and a seventh selection transistor TR7 connected to the eighth active resistor R8 may be positioned in the second selection transistor region B2. A sixth selection transistor TR6 connected to the sixth active resistor R6 and an eighth selection transistor TR8 connected to the eighth active resistor R8 may be positioned in the third selection transistor region B3.

The first gate layer G1 may be connected to the gate of the first selection transistor TR1 of the first selection transistor region B1 and the gate of the fifth selection transistor TR5 of the second selection transistor region B2. The second gate layer G2 may be connected to the gates of the second selection transistor TR2 of the second selection transistor region B2 and the sixth selection transistor TR6 of the third selection transistor region B3. The third gate layer G3 may be connected to the gate of the third selection transistor TR3 of the first selection transistor region B1 and the gate of the seventh selection transistor TR7 of the second selection transistor region B2. The fourth gate layer G4 may be connected to the gates of the fourth selection transistor TR4 of the second selection transistor region B2 and the eighth selection transistor TR8 of the third selection transistor region B3.

Figure 12:
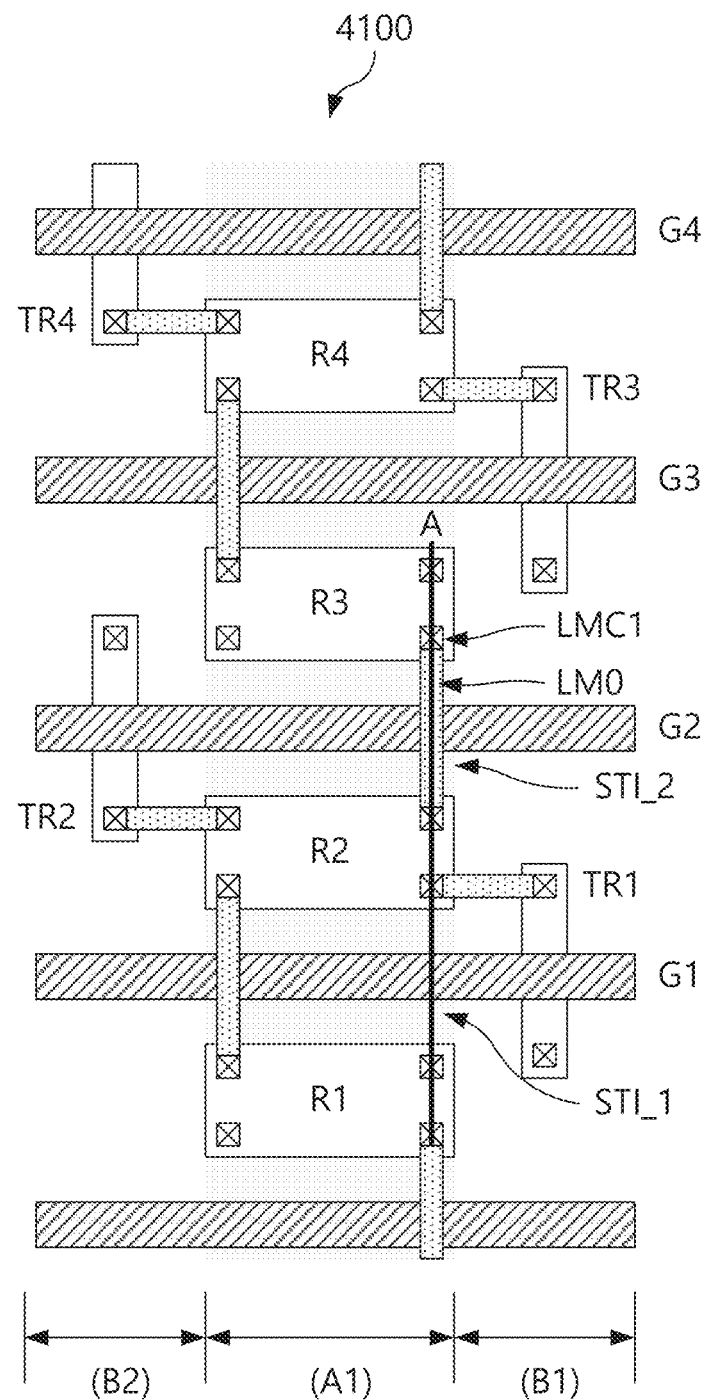
FIG. 12 is a layout diagram illustrating the first active resistor chain shown in FIG. 11.
Figure 13:
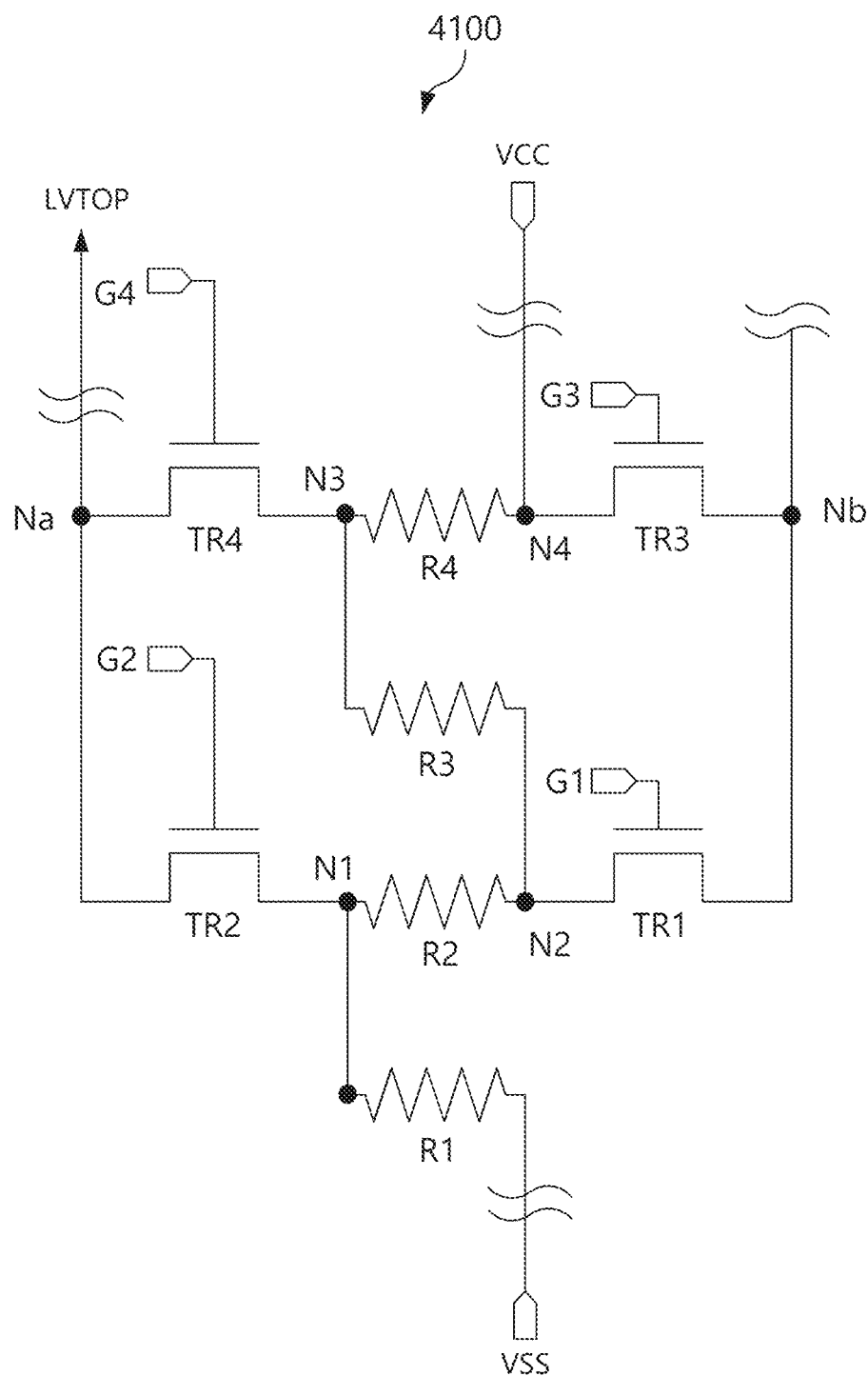
FIG. 13 is a circuit diagram of the first active resistor chain shown in FIG. 12.

FIG. 12 is a layout diagram illustrating the first active resistor chain shown in FIG. 11. FIG. 13 is a circuit diagram of the first active resistor chain shown in FIG. 12. Referring to FIGS. 12 and 13, in the first active resistor chain 4100, first to fourth active resistors R1-R4 may be connected (e.g. in series) in a chain form through a lower metal line LM0. The first active resistor R1 is connected to the first node N1, the second active resistor R2 is connected between the first node N1 and the second node N2, and the third active resistor R3 may be connected between the second node N2 and the third node N3, and the fourth active resistor R4 may be connected between the third node N3 and the fourth node N4.

The first selection transistor TR1 may be connected between the b node Nb and the second node N2 through the lower metal line LM0, and may receive a signal through the first gate layer G1. The second selection transistor TR2 is connected between the "a" node Na and the first node N1, and may receive a signal through the second gate layer G2. The third selection transistor TR3 is connected between the "b" node Nb and the fourth node N4, and may receive a signal through the third gate layer G3. The fourth selection transistor TR4 is connected between the "a" node Na and the third node N3 and may receive a signal through the fourth gate layer G4. While the TOP signal and the B signal are activated (see FIG. 4), when the second gate layer G2 is activated, the divide voltage of the first node N1 may be provided to the LVTOP terminal through the "a" node Na.

Figure 14:
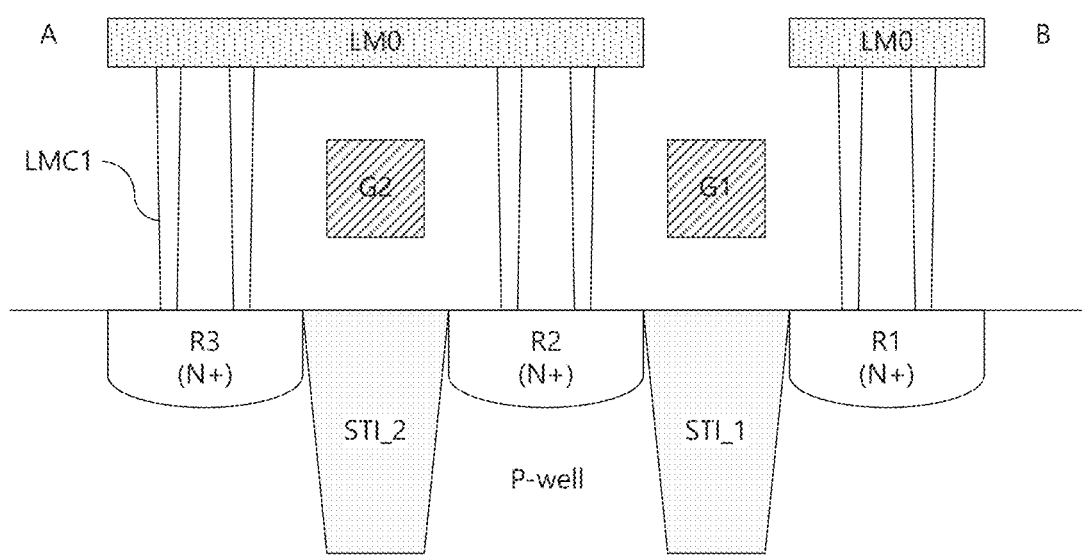
FIG. 14 is a cross-sectional view showing a vertical section between A-B in the layout diagram of the first active resistor chain shown in FIG. 12.

FIG. 14 is a cross-sectional view showing a vertical section between A-B in the layout diagram of the first active resistor chain shown in FIG. 12. Referring to FIG. 14, the first active resistor chain 4100 may form a trench in the semiconductor substrate P-well. In this case, a shallow trench isolation (STI) process for forming a device isolation layer by filling the inside of the trench with an insulating layer may be used.

When the active resistor array is implemented using a semiconductor process, a lower metal line LM0, an intermediate metal line LM1, and an upper metal line LM2 may be sequentially formed on a semiconductor substrate. FIG. 14 shows an example in which the lower metal line LM0 is formed in the first active resistor chain 4100. The first active resistor chain 4100 may electrically connect the first to third active resistors R1, R2, and R3 to the lower metal line LM0 through the lower metal contact LMC1. For example, the first to third active resistors R1, R2, and R3 may form an active resistor chain through the lower metal contact LMC1 and the lower metal line LM0.

Referring to FIGS. 12 and 14, the first device isolation layer STI_1 may be formed between the first and second active resistors R1 and R2. The second device isolation layer STI_2 may be formed between the second and third active resistors R2 and R3. The first gate layer G1 is connected to the gate of the first selection transistor TR1 and may pass over the first device isolation layer STI_1. Referring to FIG. 11, the first gate layer G1 may pass under the lower metal line LM0 connecting the first and second active resistors R1 and R2 and may be connected to the gate of the fifth select transistor TR5. The first gate layer G1 may pass over the device isolation layer between the fifth and sixth active resistors R5 and R6.

The second gate layer G2 may pass over the second device isolation layer STI_2 and may pass under the lower metal line LM0 connecting the second and third active resistors R2 and R3. Referring to FIG. 11, the second gate layer G2 is connected to the gate of the second selection transistor TR2. The second gate layer G2 may be pass over the device isolation layer STI between the sixth and seventh active resistors R6 and R7 and below the lower metal line LM0 connecting the sixth and seventh active resistors R6 and R7. The second gate layer G2 may be connected to the gate of the sixth selection transistor TR6.

Figure 15:
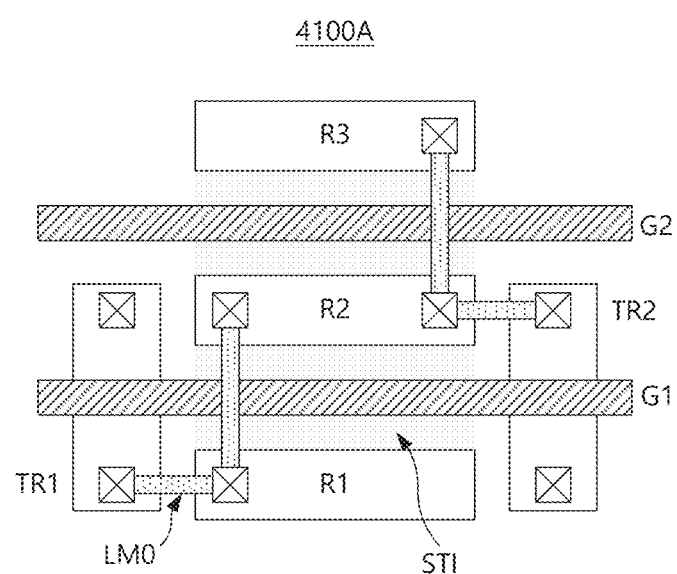
FIG. 15 is a layout diagram illustrating a modified example of the first active resistor chain shown in FIG. 12.

FIG. 15 is a layout diagram illustrating a modified example of the first active resistor chain shown in FIG. 12. Referring to FIG. 15, in the first active resistor chain 4100A, first to third active resistors R1-R3 may be connected in a chain form through a lower metal line LM0. The first selection transistor TR1 may be connected to the first active resistor R1 through the lower metal line LM0, and may receive a signal through the first gate layer G1. The second selection transistor TR2 may be connected to the second active resistor R2 through the lower metal line LM0 and may receive a signal through the first gate layer G1.

The device isolation layer STI may be formed between the first and second active resistors R1 and R2. The first gate layer G1 may be connected to the gate of the first selection transistor TR1 and pass above the device isolation layer STI and below the lower metal line LM0 connecting the first and second active resistors R1 and R2. The first gate layer G1 may be connected to the gate of the second selection transistor TR2.

As described above, the active resistor array 4000 shown in FIG. 10 may connect the gates of the selection transistors (e.g., TR1 and TR5 in FIG. 11) in a plurality of active resistor chains through one gate layer (e.g., G1 of FIG. 11). The semiconductor memory device having the active resistor array shown in FIG. 10 does not require or utilize signal lines for providing gate control signals because the gates of the selection transistors in different active resistor chains are connected as one gate layer. Since the semiconductor memory device having the active resistor array shown in FIG. 10 does not require a separate LM0 wiring space for the gate control signal of the selection transistor, the chip size may be reduced.

Since the semiconductor memory device having the active resistor array shown in FIG. 10 may arrange a plurality of active resistor chains at regular intervals, a layout pattern may be made more uniform. Since example embodiments may help to ensure the uniformity of the layout pattern, active resistance distribution may be improved due to reduction in process variation. Alternatively or additionally, since the semiconductor memory device having the active resistor array shown in FIG. 10 may reduce the distance between the active resistor chains, differential non-linearity (DNL) circuit characteristics of the entire active resistor chain may be improved.

Figure 16:
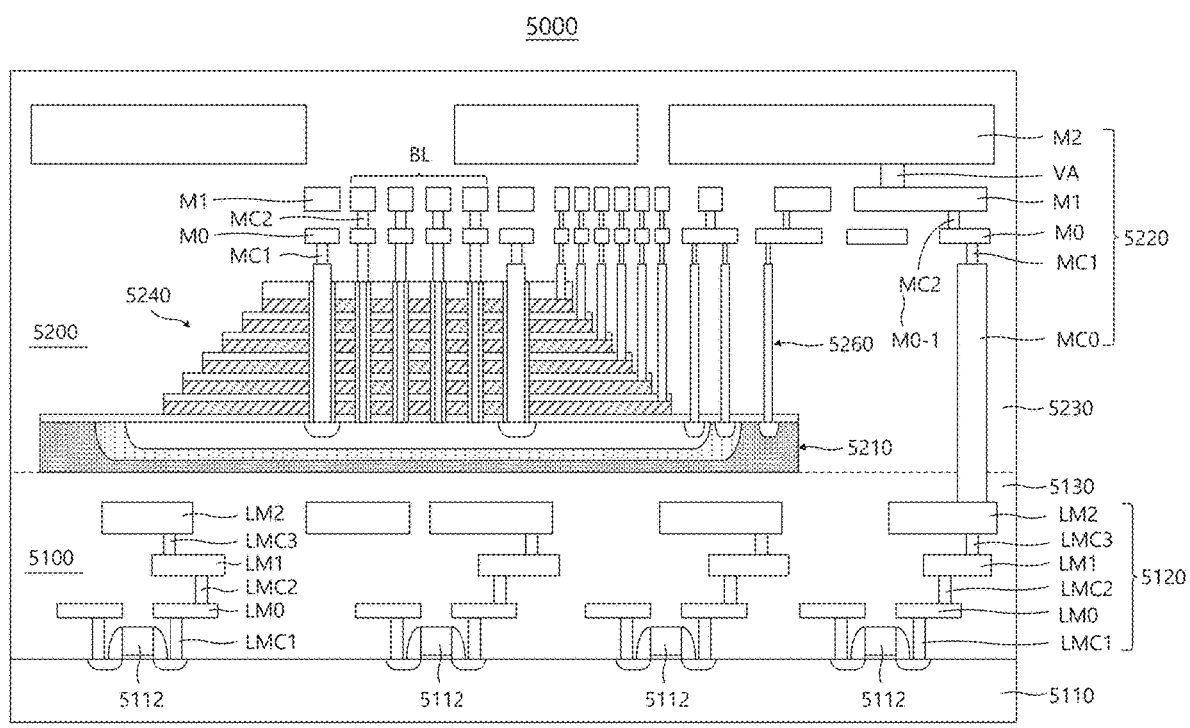
FIG. 16 is a cross-sectional view illustrating a semiconductor memory device having a cell-over-periphery (COP) structure according various example embodiments.

The semiconductor memory device having an active resistor array according to the present invention may also be applied to a semiconductor memory device having a cell-over-periphery (COP) structure. FIG. 16 is a cross-sectional view illustrating a semiconductor memory device having a COP structure according various example embodiments. Referring to FIG. 16, the semiconductor memory device 5000 may have a cell on peripheral (COP) structure in which a memory cell area 5200 is stacked on a peripheral circuit area 5100. At least a portion of the peripheral circuit area 5100 and at least a portion of the memory cell area 5200 may vertically overlap.

The peripheral circuit area 5100 may include at least one peripheral transistor 5112 disposed on a lower substrate 5110, a peripheral circuit wiring 5120 electrically connected to the peripheral transistor 5112, and a lower insulating layer 5130 covering at least the peripheral circuit wiring 5120 and the peripheral transistor 5112. Meanwhile, the peripheral circuit area 5100 may include the active resistor array described above. The active resistor array may include an active resistor area and a selection transistor area. The active resistor array may be formed between the peripheral transistors 5112 of the lower substrate 5110, and the selection transistor area may be formed of the peripheral transistors 5112.

The memory cell area 5200 may include an upper substrate 5210, a cell array 5240 disposed on the upper substrate 5210, and an upper insulating layer 5230 covering the cell array 5240. The memory cell area 5200 may further include a connection circuit wiring 5220 electrically connecting the cell array 5240 and the peripheral circuit area wiring 5120. The cell array 5240 may include a metal contact 5260 electrically connecting the cell array 5240 to the connection circuit wiring 5220.

In the peripheral circuit area 5100, the lower substrate 5110 may include a semiconductor substrate (e.g., a silicon chip formed from a silicon wafer). As an example, the peripheral circuit wiring 5120 may include a lower metal line LM0, an intermediate metal line LM1, and an upper metal line LM2, which are vertically stacked on and from the lower substrate 5110. The peripheral circuit wiring 5120 may further include a lower metal contact LMC1 electrically connecting the peripheral transistor 5112 with the lower metal line LM0, an intermediate metal contact LMC2 electrically connecting the lower metal line LM0 with the intermediate metal line LM1, and an upper metal contact LMC3 electrically connecting the intermediate metal line LM1 with the upper metal line LM2.

In the memory cell area 5200, the cell array 5240 may have a three-dimensional structure in which a plurality of cells are vertically stacked on an upper substrate 5210 having a well structure. The metal contact 5260 may be provided to electrically connect the plurality of cells of the cell array 5240 to the connection circuit wiring 5220 of the upper substrate 5210.

The connection circuit wiring 5220 may be electrically connected to the peripheral circuit area wiring 5120. The connection circuit wire 5220 may include a lower metal wire M0, an intermediate metal wire M1, and an upper metal wire M2 sequentially stacked on the cell array 5240. The connection circuit wiring 5220 electrically connects the connection metal contact MC0 that electrically connects the peripheral circuit area wiring 5120 to the connection circuit wiring 5220, the connection metal contact MC0, and the lower metal wiring M0. a lower metal contact MC1 to electrically connect the lower metal wire M0 to the intermediate metal wire M1, and an intermediate metal contact MC2 to electrically connect the middle metal wire M1 to the upper metal wire M2. A via VA may be further included as an upper metal contact. The lower metal contact MC1 may connect the cell array 5240 to the intermediate metal line M0. The intermediate metal wiring M1 may include a bit line BL electrically connected to a vertical channel of the cell array 5240.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While example embodiments have been described with reference to embodiments thereof, it will be apparent to those of ordinary skill in the art that various changes and modifications may be made thereto without departing from the spirit and scope of various example embodiments as set forth in the following claims. Furthermore example embodiments are not necessarily mutually exclusive with one another. For example, some example embodiments may include one or more features described with reference to one or more figures, and may also include one or more other features described with reference to one or more other figures.

What is claimed is:

1. An active resistor array of a semiconductor memory device, comprising:
   a first active resistor in a first active resistor region;
   a second active resistor in the first active resistor region and arranged in parallel with the first active resistor, and an isolation element layer interposed between the second active resistor and the first active resistor;
   a third active resistor in a second active resistor region;
   a first selection transistor in a first selection transistor region and connected to the second active resistor; and
   a second selection transistor in a second selection transistor region and connected to the third active resistor;
   wherein the first and second selection transistors are connected to a same gate layer, and
   the gate layer of the first and second selection transistors is on the isolation element layer.

2. The active resistor array of claim 1,
   wherein the first and second active resistors are connected through a lower metal contact and a lower metal line, and
   the gate layer of the first and second selection transistors extends over the isolation element layer and is below the lower metal line.

3. The active resistor array of claim 1, further comprising:
   a fourth active resistor in the second active resistor region and in parallel with the third active resistor, and a second isolation element layer between the third active resistor and the fourth active resistor,
   wherein the gate layer of the first and second selection transistors is on the second isolation element layer.

4. The active resistor array of claim 3,
   wherein the third and fourth active resistors are connected through a lower metal contact and a lower metal line, and
   the gate layer of the first and second selection transistors extends over the second isolation element layer and is below the lower metal line.

5. The active resistor array of claim 1,
   wherein the active resistor array is in a peripheral circuit area of the semiconductor memory device and is at least a component of a voltage divider configured to generate an internal power supply of the semiconductor memory device.

6. An active resistor array of a semiconductor memory device, comprising:
   a first active resistor region in which a first plurality of active resistors are arranged in a first direction with a first isolation element layer between ones of the first plurality of active resistors;
   a second active resistor region in which a second plurality of active resistors are disposed in the first direction with a second isolation element layer between ones of the second plurality of active resistors; and
   a selection transistor region between the first and second active resistor regions,
   wherein in the selection transistor region, a first selection transistor connected to a one of the first plurality of active resistors of the first active resistor region and a second selection transistor connected to a one of the second plurality of active resistors of the second active resistor region are alternately arranged in the first direction, and
   a gate layer of a selection transistor in the selection transistor region passes over the first and second isolation element layers in the first and second active resistor regions in a second direction perpendicular to the first direction.

7. The active resistor array of claim 6,
   wherein in the first active resistor region, first and second active resistors are in the first direction with at least a portion of the first isolation element layer between the first and second active resistors,
   in the second active resistor region, third and fourth active resistors are in the first direction with at least a portion of the second isolation element layer between the third and fourth active resistors,
   the selection transistor region comprises a first selection transistor coupled to the second active resistor and a second selection transistor connected to the fourth active resistor, and a gate layer of the second selection transistor is on the first and second isolation element layers in the second direction.

8. The active resistor array of claim 7, wherein the first and second active resistors are connected through a lower metal contact and a lower metal line, and
the gate layer of the second selection transistor extends over the first and second isolation element layers and is below the lower metal line.

9. The active resistor array of claim 8, wherein the first active resistor region includes a fifth active resistor in parallel with the second active resistor, and at least a portion of a third isolation element layer between the fifth active resistor and the second active resistor,
wherein the second and fifth active resistors are connected through a lower metal contact and a lower metal line, and
the gate layer of the first selection transistor extends over the third isolation element layer and is below the lower metal line.

10. The active resistor array of claim 9, wherein the second active resistor region includes a sixth active resistor in parallel with the fourth active resistor, and at least a portion of a fourth isolation element layer between the fourth active resistor and the sixth active resistor,
the fourth and sixth active resistors are connected through a lower metal contact LMC1 and a lower metal line LM0, and
wherein a gate layer of the first selection transistor extends over the third and fourth isolation element layers and below the lower metal line.

11. An active resistor array of a semiconductor memory device, comprising:
a first active resistor on a semiconductor substrate;
a second active resistor in parallel with the first active resistor, and a first isolation element layer the first active resistor and the second active resistor; and
a gate layer of a transistor, the gate layer on the first isolation element layer, the transistor configured to select the first active resistor or the second active resistor.

12. The active resistor array of claim 11, wherein the first and second active resistors are connected through a lower metal contact and a lower metal line, and
wherein the gate layer of the transistor extends over the first isolation element layer and is below the lower metal line.

13. The active resistor array of claim 12, wherein the transistor comprises,
a first selection transistor configured to select the first active resistor; and
a second selection transistor configured to select the second active resistor,
wherein the first and second selection transistors are in different selection transistor regions.

14. The active resistor array of claim 13, wherein the first selection transistor is connected to the first active resistor, and
the second selection transistor is connected to the second active resistor.

15. The active resistor array of claim 13, wherein the first and second selection transistors are connected to the second active resistor.

16. The active resistor array of claim 15, further comprising:
a third active resistor in parallel with the second active resistor, and a second isolation element layer between the third active resistor and the second active resistor,
wherein the second and third active resistors are connected through a lower metal contact and a lower metal line, and
a gate layer of the second selection transistor extends over the second isolation element layer and is below the lower metal line.

17. The active resistor array of claim 16, wherein a gate layer of the first selection transistor extends over the first isolation element layer and is below the lower metal line.

18. The active resistor array of claim 11, wherein the active resistor array is in a peripheral circuit area of the semiconductor memory device and is at least a component of a voltage divider configured to generate an internal power supply of the semiconductor memory device.

19. The active resistor array of claim 18, wherein the semiconductor memory device is configured to have a cell-over-periphery (COP) structure in which a memory cell area is positioned on the peripheral circuit area.

20. The active resistor array of claim 18, wherein the semiconductor memory device includes a flash memory.

* * * * *